United States Patent [19]
Van Berkel

[11] Patent Number: 5,451,766
[45] Date of Patent: Sep. 19, 1995

[54] IMAGING DEVICE CONTAINING AN ELECTROOPTIC MATERIAL TO ADJUST THE EFFECTIVE FOCAL LENGTH OF A LENS ELEMENT

[75] Inventor: Cornelis Van Berkel, Hove, England

[73] Assignee: U.S. Philips Corporation, New York, N.Y.

[21] Appl. No.: 273,531

[22] Filed: Jul. 11, 1994

[30] Foreign Application Priority Data

Jul. 12, 1993 [GB] United Kingdom ............ 9314402

[51] Int. Cl.⁶ ..................... H01J 3/14; H01J 5/16; H01J 40/14
[52] U.S. Cl. ............... 250/208.1; 250/216; 359/94
[58] Field of Search ............ 359/619, 620, 626, 454, 359/455, 245, 248, 259, 40, 41, 94; 250/208.1, 216

[56] References Cited

U.S. PATENT DOCUMENTS

| | | | |
|---|---|---|---|
| 4,395,736 | 7/1983 | Fraleux | 358/213 |
| 4,609,824 | 9/1986 | Munier et al. | 250/578 |
| 4,836,652 | 6/1989 | Oishi et al. | 359/40 |
| 4,927,241 | 5/1990 | Kuijk | 350/336 |
| 4,945,242 | 7/1990 | Berger et al. | 250/367 |
| 4,952,788 | 8/1990 | Berger et al. | 250/208.1 |
| 5,239,412 | 8/1993 | Naka et al. | 359/619 |
| 5,306,926 | 4/1994 | Yonemoto | 259/432 |
| 5,324,930 | 6/1994 | Jech, Jr. | 250/216 |
| 5,352,886 | 10/1994 | Kane | 260/216 |
| 5,359,444 | 10/1994 | Piosenka et al. | 359/94 |

FOREIGN PATENT DOCUMENTS

0154962 9/1985 European Pat. Off. .
0233104 8/1987 European Pat. Off. .
0237365 9/1987 European Pat. Off. .

OTHER PUBLICATIONS

"Microlens Arrays" M. Hutley et al., Physics World, Jul. 1991, pp. 27–32.

*Primary Examiner*—David C. Nelms
*Assistant Examiner*—Stephen Calogero
*Attorney, Agent, or Firm*—Jack D. Slobod

[57] ABSTRACT

A first substrate (2) carries an array (3) of imaging elements (4). An array (5) of lens elements (6) is provided with each lens element (6) associated with at least one imaging element (4) for concentrating light (L) travelling on a light path between the imaging element (4) and the at least one lens element (6). An electro-optic material (8) having an electrically alterable refractive index is provided in a space defined between a second substrate (7) and one of the imaging element and the lens element arrays (3 and 5). Electrodes (8a,8b) are provided for applying an electrical potential across the electro-optic material (8) to adjust the effective focal length of the lens elements (6). The focal length of the lens elements (6) can thus be adjusted by applying or varying the potential applied across the electro-optic material so that the focus of the imaging device is not entirely dependent on the nature and construction of the lens elements (6).

20 Claims, 2 Drawing Sheets

IMAGING DEVICE CONTAINING AN ELECTROOPTIC MATERIAL TO ADJUST THE EFFECTIVE FOCAL LENGTH OF A LENS ELEMENT

BACKGROUND OF THE INVENTION

This invention relates to an imaging device.

EP-A-154962 describes an imaging device in the form of an image sensor comprising a first substrate carrying an array of photosensitive elements. In the image sensor described in EP-A-154962, each photosensitive element is associated with a respective lens element for focussing light incident on the lens element onto the associated photosensitive element. As described in EP-A-154962, the photosensitive elements are formed by thin-film technology on one surface of an insulating substrate and the lens elements are formed on the other surface of the same substrate by, for example, locally altering the refractive index of the substrate. In such a case, the focal length of the image sensor is of course determined by the construction of the lenses and in practice will be limited by the technology used to form the lens.

SUMMARY OF THE INVENTION

It is an aim of the present invention to provide an imaging device for which the focal length is not completely dependent upon the construction of the lenses and which may allow for adjustment of the focal length.

According to the present invention, there is provided an imaging device comprising a first substrate carrying an array of imaging elements and an array of lens elements with each lens element being associated with at least one imaging element for concentrating light travelling on a light path between the imaging element and the at least one lens element, characterised in that an electro-optic material having an electrically alterable refractive index is provided in a space defined between a second substrate and one of the imaging element and the lens element arrays and in that means are provided for applying an electrical potential across the electro-optic material to adjust the effective focal length of the lens elements.

Thus, in an imaging device in accordance with the invention, the focal length of the lenses can be adjusted by applying or varying a potential applied across the electro-optic material so that the focal length is not entirely dependent on the nature and construction of the lens elements.

In one example the lens element array is carried by the second substrate and the space for the electro-optic material is provided between the imaging element array and the second substrate.

In another example the space for the electro-optic material is provided between the lens element array and the second substrate.

The means for applying an electrical potential across the electro-optic material may comprise a light-transmissive electrode carried by the second substrate adjacent the electro-optic material.

The means for applying an electrical potential across the electro-optic material may comprise a further light transmissive electrode associated with the one of the imaging element and the lens element array. As another possibility, the means for applying an electrical potential across the electro-optic material may comprise a respective further electrode associated with each element of the one of the imaging element array and the lens elements array, with each further electrode being associated with a respective switching element for controlling the application of an electrical potential between that further electrode and the light-transmissive electrode carried by the second substrate. This may enable the focus of each lens to be controlled separately or may enable the liquid crystal to be used as a shutter element to mask one or more selected photosensitive elements.

Usually, the electro-optic material comprises a liquid crystal, typically a twisted nematic liquid crystal although any suitable electro-optic material may be used.

Preferably, each lens is associated with a single photosensitive element.

Each photosensitive element may comprise a photosensitive diode such as an n-i-p diode, although other photosensitive elements such as photosensitive resistors or photosensitive transistors may be used.

Each photosensitive element may be associated with a respective switching element for controlling operation of the photosensitive element.

Preferably, the array of photosensitive elements comprises a two-dimensional array of thin-film photosensitive elements, typically an active matrix addressed array with each photosensitive element associated with a respective switching element.

The array of photosensitive elements may be provided on a surface of the first substrate facing the second substrate.

It should be understood that as used herein the term light includes electromagnetic radiation visible to the human eye plus the near infrared.

BRIEF DESCRIPTION OF THE DRAWINGS

Embodiments of the invention will now be described by way of example with reference to the accompanying drawings, in which.

DETAILED DESCRIPTION OF THE PREFERRED EMBODIMENTS

Figure 1:
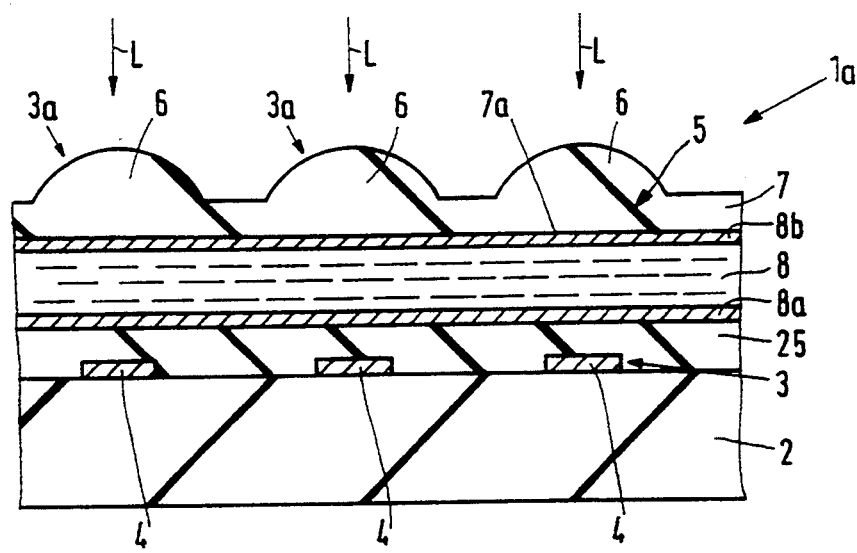
FIG. 1 is a very schematic simplified cross-sectional view through part of one example of an imaging device in accordance with the invention.

It should of course be understood that the drawings are not to scale and that various dimensions, especially the thickness of layers, may have been relatively exaggerated in the interests of clarity in the drawings.

Referring now to the drawings, especially the very schematic FIG. 1, there is illustrated an imaging device 1a comprising a first substrate 2 carrying an array 3 of imaging elements 4 and an array 5 of lens elements 6 with each lens element 6 being associated with at least one imaging element 4 for concentrating light L travelling on a light path between the imaging element 4 and the at least one lens element 6. In accordance with the invention, an electro-optic material 8 having an electrically alterable refractive index is provided in a space defined between a second substrate 7 and one of the imaging element and the lens element arrays 3 and 5 and means 8a,8b are provided for applying an electrical potential across the electro-optic material 8 to adjust the effective focal length of the lens elements 6. Thus the focal length or focal point of the lens elements 6 can be adjusted by applying or varying the potential applied across the electro-optic material so that the focus of the imaging device is not entirely dependent on the nature and construction of the lens elements 6.

FIG. 1 is a simplified cross-sectional view of a first example of an imaging device 1a is accordance with the invention. In this example, the imaging elements 4 are formed as photosensitive elements, for example photosensitive p-i-n diodes, using thin-film technology on an insulating first substrate 2. The insulating first substrate 2 will generally be formed of glass but could be formed of any suitable material capable of withstanding the subsequent processing and providing the necessary support; for example a suitable plastics material could be used.

Although the imaging elements 4 could constitute a passive array, in this example the imaging device comprises an active array in which each imaging element 4 can be individually addressed via a suitable switching element. Also, although the present invention could be applied to a linear array which senses an image by causing relative movement between the array and the image, it is preferred in the present case that the array 3 constitute a two-dimensional matrix array 3 capable of forming images in a manner analogous to that of conventional optical cameras or displays.

In the interests of simplicity in FIG. 1 only the photosensitive elements 4 of the array 3 are shown. However, as will be appreciated by those skilled in the art, the array will also include row and column addressing conductors and, in the case of an active matrix, switching elements associated with the photosensitive elements 4.

The array 3 is covered by a passivating layer 25 which may, in this example, be a polyimide, silicon oxide or silicon nitride layer, although any suitable insulating material which is sufficiently transmissive at the operational wavelengths of the imaging device 1a may be used. A first light-transmissive, for example indium tin oxide (ITO) electrode 8a is provided over the passivating layer 25.

In this example, the lens element array 5 is provided on the second substrate 7, which again may be any suitable glass or plastics material substrate, using any suitable known technique as will be explained in more detail below with reference to FIG. 4. A second light-transmissive electrode 8b, again for example formed of indium tin oxide, is provided on the surface 7a of the second substrate 7 opposed to the lens element 6 array 5.

The electro-optic material 8 is in this example a suitable liquid crystal material, generally a twisted nematic liquid crystal, and is sandwiched between the array 3 and the second substrate in a manner analogues to that conventionally used to manufacture liquid crystal displays. As will be appreciated by those skilled in the art of liquid crystal display, although not shown, appropriate orientation layers, and if desired, filter layers may be provided on one or both of the first and second electrodes 8a and 8b.

Each photosensitive element 4 and the associated lens element 2 defines a picture element 3a of the imaging device 1a.

In operation of the imaging device 1a shown in FIG. 1, the lens elements 6 concentrate light onto the associated photosensitive elements 5. If it is desired to alter the optical path length between the lens elements 6 and the associated photosensitive elements 4, for example to adjust or sharpen the focussing of an image, then an electrical potential is applied across the first and second light transmissive electrodes 8a and 8b which causes the refractive index of the electro-optic material 8 to alter so as to change the effective optical path length through the electro-optic material 8 and so effectively move the focal point of the lens elements 6 towards or away from the photosensitive elements 4. The degree to which the effective focus of the lens elements 6 can be adjusted will of course depend upon the degree to which the refractive index of the electro-optic material is affected by the applied potential and the thickness of the electro-optic material 8 which may be adjusted to suit the particular requirements.

Figure 2:
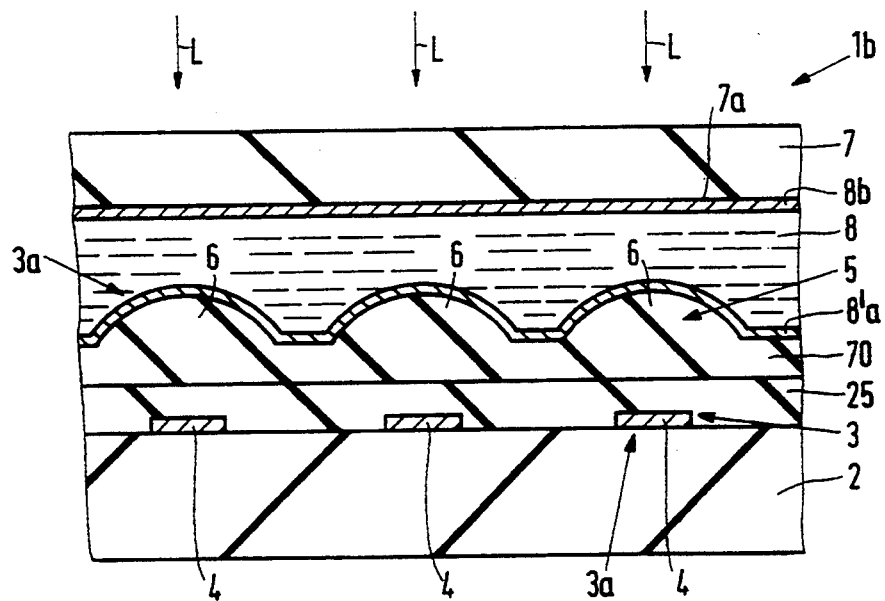
FIG. 2 is a very schematic simplified cross-sectional view through part of a second example of an imaging device in accordance with the invention.

FIG. 2 is a simplified cross-sectional view similar to FIG. 1 of another example of an imaging device 1b in accordance with the invention.

The imaging device 1b differs from that shown in FIG. 1 in that the lens element 6 array 5 is provided on the array 3, either directly onto the passivating layer 25 or as shown on a separate substrate 70 (which again may be a glass or plastics substrate) provided over the passivating layer 25. In this example, the first light-transmissive electrode 8a is provided on the surface of the lens element 6 array 5. The second light transmissive electrode 8b is provided on a surface 7a of the second substrate 7. In this case, the electro-optic material 8 is sandwiched between the second substrate 7 and the further substrate 70 carrying the lens element 6 again using technology analogous to that used for manufacturing liquid crystal displays. Depending upon the viscosity of the electro-optic material, the periphery of the further substrate 70 carrying the lens element array 6 may be bonded to the periphery of the second substrate 7 using a suitable UV (ultraviolet) curable adhesive leaving a gap through which the space between the substrates 7 and 70 is filled by the electro-optic material 8 by dipping the cell structure into the electro-optic material 8 under vacuum. Once the cell structure is filled with the electro-optic material, then the gap is sealed. Where such a technique is unsuitable because of the nature of the electro-optic material then the electro-optic material may be applied using conventional techniques to one of the substrates 7 and 70 and the substrates 7 and 70 then brought together and sealed by a similar UV curable adhesive located at the peripheries of the substrates 7 and 70.

Again, the application of an electrical potential across the electrodes 8a and 8b allows the refractive index of the electro-optic material 8 to be adjusted so allowing the focal length of the lens element 6 to be adjusted in accordance with the following equation:

$$fm = fa \cdot n_m (n_1)/(n_1 - n_m)$$

where fm is the focal length of the lens elements 6 in the electro-optic material 8, fa is the focal length of the lens elements 6 in air, $n_1$ is the refractive index of the lens elements 6, and $n_m$ is the refractive index of the medium through which the light L is travelling as it is incident on the lens elements 6.

Figure 3:
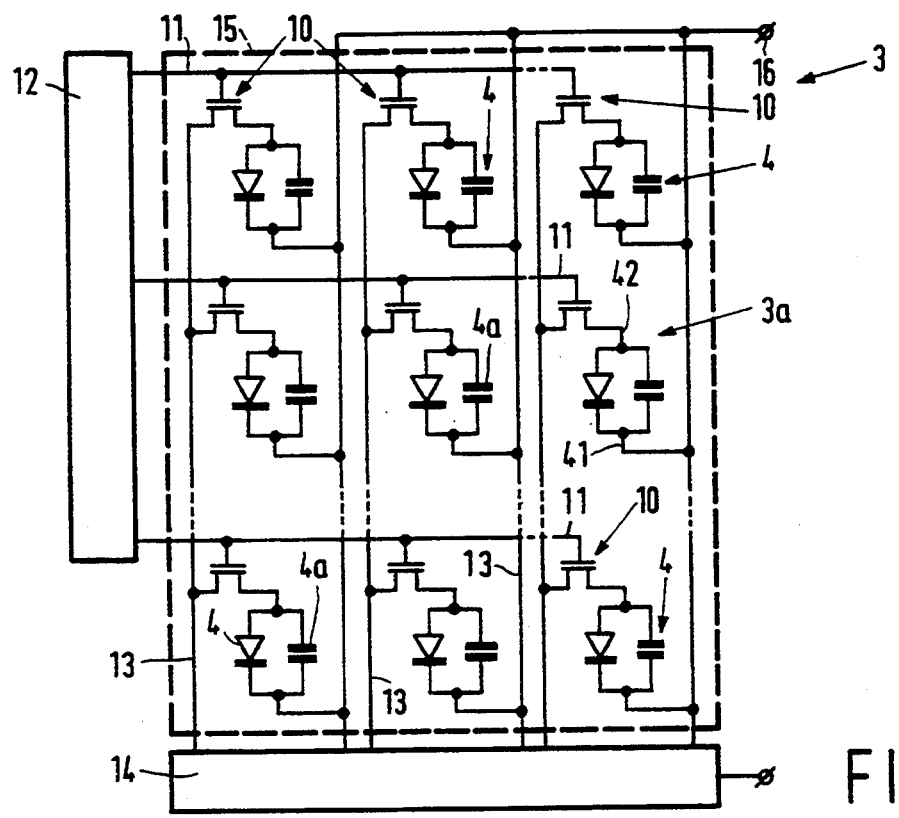
FIG. 3 is a schematic circuit layout for one example of a photosensitive array suitable for use in an imaging device in accordance with the invention.

FIG. 3 is a circuit layout for one example of a suitable active matrix addressed photosensitive element array 3 which may be used in the imaging device 1a or 1b. In this example, the photosensitive elements 4 are photosensitive diodes (photodiodes) and the array 3 comprises a two dimensional array of photodiodes 4 with a pitch of typically 200 μm (micrometers) or less and an overall size of up to about 400 by 400 mm. For convenience only a portion of the array is shown in full in FIG. 3.

Each photodiode 4 is shown in parallel with a capacitor 4a which in this case represents the parasitic or self-capacitance of the diode 4 but which may also include an additional capacitor to improve the dynamic range of the detector.

The photodiodes 4 are arranged in a matrix array and each is associated with a respective switching element, in this example a transistor 10.

The transistors 10 are arranged in a matrix of 1−m rows and 1−n columns (only three rows and three columns are shown) with the gate of each transistor in a given row being connected to a given row conductor 11 of a row driver or decoder/addressing circuit 12 and the source of each transistor 10 in a given column being connected to a given column conductor 13 of a column decoder/addressing circuit 14 including read out amplifiers of an appropriate conventional type. The dashed line 15 indicates the extent of the electromagnetic radiation detecting area of the photodetector array.

A first electrode 41 of each photosensitive diode 4 (as represented by the cathode of the diode) is connected to a common line 16 while the second electrode 42 of each photosensitive diode (represented by the anode of the diode) is connected to a main electrode of the associated switching element 10, in this example to the drain electrode 10d of the associated transistor 10.

It will of course be appreciated that other forms of photosensitive arrays 3 may be used in an imaging device in accordance with the invention. For example, any of the thin-film photosensitive array circuit layouts described in any of EP-A-233104, EP-A-237365, U.S. Pat. No. 4,395,736, U.S. Pat. No. 4,609,824, U.S. Pat. No. 4,945,242 and U.S. Pat. No. 4,952,788 could be used. In particular, each photodiode may also act, with appropriate addressing, as the switching element so that no additional switching element is required; see for example EP-A-233104.

Figure 4:
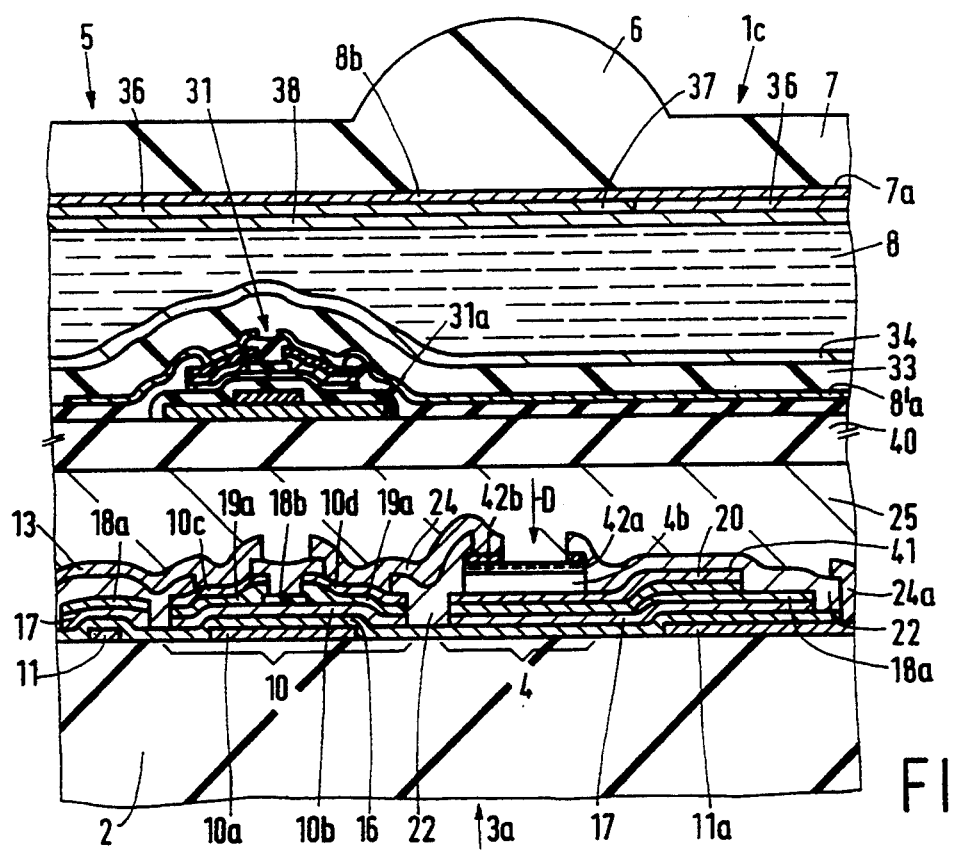
FIG. 4 is a cross-sectional view of the major portion of one picture element (pixel) of another embodiment of an imaging device in accordance with the invention.

FIG. 4 illustrates in greater detail than FIG. 1 or FIG. 2, one example part of one imaging element 3a of an imaging device 1c in accordance with the invention incorporating a photosensitive array 3 having the layout shown in FIG. 3.

In the example illustrated in FIG. 4, the first substrate 2 is an insulating substrate generally a glass layer onto which layers are deposited and patterned to define a first metallisation level providing the control or gate electrodes 10a of the transistors 10, the gate lines or row conductors 11 and necessary connection areas 11a for enabling connection of the row conductors 11 to higher metallisation level. The first metallisation level is covered by an insulating layer 16 to form the transistor gate insulator and then an amorphous silicon layer 17 parts of which will form the transistor conduction channel regions 10b.

A protective insulating layer, generally a silicon nitride layer, may provide areas 18a over the row conductors 11 and the connection area 11a so as to increase the thickness of overlying insulator, thereby reducing the parasitic capacitance and the possibility of electrical shorts, between those regions of the first metallisation level and subsequent overlying metallisation and a further area 18b over a central region of each transistor 10 so as to act as an etch stop. A doped, generally an n conductivity type, semiconductor layer 19 is then deposited followed by a second metallisation level or layer 20.

The doped semiconductor layer 19 may be formed of the same material as the intrinsic semiconductor layer 17, for example amorphous or polycrystalline silicon. The second metallisation layer 20 may be a chrome layer.

Further semiconductor layers are then deposited. Generally these will consist of an n conductivity type layer, an intrinsic type layer and a p conductivity type layer, followed by a transparent electrically conductive layer, for example an indium tin oxide (ITO) layer and a further chrome layer which acts to protect the ITO layer during subsequent processing. These layers are then sequentially patterned using a third single mask but different etching processes to define the photosensitive elements 4 such that each photosensitive element 4 consists of a n-i-p active device region 4b diode structure (shown unhatched in the Figures) on top of the second metallisation layer 20 followed by a transparent ITO electrode portion 42b and a chrome electrode portion 42a with the transparent ITO and chrome electrode portions 42b and 42a together forming the second electrode 42 of the photosensitive element 4.

A fourth mask is then provided and the second metallisation level 20, doped semiconductor layer 19 and intrinsic semiconductor layer 17 are then sequentially patterned using appropriate photolithographic and etching techniques to define, the source and drain electrodes 10c and 10d source and drain n conductivity type contact regions 19a and the intrinsic conduction channel region 10b for each thin-film transistor 10 as well as the first electrode 41 of each photosensitive element 4. The source and drain contact regions 19a need not necessarily be provided in which case the layer 19 would be omitted. A fifth mask (not shown) is then used to enable the gate insulating layer 16 to be removed from part 11a of the connection area 11a adjacent the periphery of the array to allow the final metallisation layer to contact the row conductors 11.

An insulating layer 22, formed of any suitable insulating material such as silicon nitride or polyimide, is then deposited and patterned using conventional techniques to define contact windows for enabling and to define an opening D over the photosensitive element 4.

A final metallisation level, generally aluminium, is then deposited and patterned to define, the column conductors 13 contacting the respective columns of source electrodes 10c, the electrical interconnections 24 between respective drain electrodes 10d and the upper, in this case, diode electrodes 42 and metallisation 24a contacting the connection area 11a at the edge of the array. During the patterning of the final metallisation level part of the chrome electrode portion 42a is removed to leave an opening over the second electrode 42 of the photosensitive element 4 to enable light to be incident on the photosensitive element 4.

The protective insulating layer 25 capable of allowing transmission of light to be detected by the photodiodes 4 is then provided over the structure. As indicated above, the protective layer 25 may be formed of any suitable electrically insulating material, for example a polyimide, silicon dioxide or silicon nitride. Where a polyimide or similar flowable then settable layer is used to form the protective layer then it may provide additional advantages in planarising the surface. This may assist in reducing possible distortions.

In this example, the electro-optic material 8 is provided between the photosensitive array 3 and the lens elements 6 array 5 which is carried on a separate second substrate 7.

As discussed above, generally, the electro-optic material will comprise a twisted nematic liquid crystal material although other suitable electro-optic materials having electrically controllable birefringence could be used. Where as discussed above with reference to FIGS. 1 and 2 it is desired merely to be able to adjust the focal length of all of the picture elements 3a at the same time so as, for example, to enable a particular image to be detected by the photosensitive array to be focussed more sharply on the array 3, then the electro-optic material 8 may simply be sandwiched between the first and second substrates 2 and 7 with respective transparent, generally indium tin oxide, electrodes provided on the opposing surfaces of the first and second substrates 2 and 7 as shown in FIG. 1 in a manner similar to that used for liquid crystal displays so as to enable an electrical potential to be applied across the liquid crystal material 8.

However, there may be cases where it is desirable, in order for example to produce special effects by defocussing or enlarging certain areas of an image or to compensate for differences between individual lenses due to the process used to manufacture the lenses, to enable the focus of each individual picture element 3a to be adjusted. This may be achieved by providing the liquid crystal material in a structure reminiscent to that used in active matrix addressed liquid crystal displays.

FIG. 4 illustrates such a structure. In the example illustrated in FIG. 4, the liquid crystal material 8 is provided on top of a structure which includes a matrix of switching elements 31 which may be any suitable non-linear elements such as MIMs or diodes but in the example shown are transistors of a structure similar to the transistors 10.

Where the protective layer 25 is capable of withstanding the subsequent processing then the switching elements 31 may be formed directly on to the protective layer 25. Alternatively the switching element 31 may be formed as shown on a separate substrate 40 which is secured by suitable adhesive to the protective layer 25. As the switching elements 31 are in this case similar to structure to those shown for the photosensitive array they will not be described in detail here save to say that the ITO diode electrode 31a of each transistor 31 is extended to form a lower electrode 8a extending over the area of the protective layer 25 associated with the corresponding picture element 3a formed by the associated lens element 6 and the photosensitive element 4 so that each picture element has its own individual lower electrode 8'a. The lower electrodes 8'a and transistors are covered by an insulating layer 33 onto which is provided an orientation layer 34 of a polymer material in a manner known for liquid crystal displays.

In the alternative case described above where a single lower electrode covers the entire photosensitive array 3, then the structure will of course differ simply by the omission of the transistors 31 so that the lower electrode 8'a, insulating layer 33 and orientation layer 34 are provided sequentially onto the protective layer 25 (or separate substrate) so as to cover the entire photosensitive array 3.

A suitable liquid crystal material, generally a twisted nematic liquid crystal material, 8 is provided on the orientation layer 34 so as to be sandwiched between the orientation layer and an upper substrate carrying a common transparent, generally ITO, electrode 8b. Although the common electrode 8a could be carried by a separate substrate, in this example it is carried by the substrate which also carries the lens elements 6. The spacing of the second substrate 7 from the photosensitive array 3 structure to define the space for the liquid crystal material and the sealing of that space may be carried out using techniques conventional in liquid crystal display technology.

The transparent common electrode 8b may carry a light shield in the form of a matrix of light shielding areas 36 of insulative material which act to shield the switching elements 31, if present, from the incident light and which also act to shield the photosensitive elements 4 from stray or scattered light, that is from light not being focussed onto the photosensitive element 4 by the associated lens element 6. The common electrode 8b may also carry a colour filter layer 37 which defines a matrix of adjacent filter regions of red, green and blue filter material arranged in known manner so that the outputs from the corresponding group of three picture elements can be combined to produce a colour image. A further orientation layer 38 is provided between the liquid crystal material and the light shielding areas 36.

The second substrate 7 which carries the lens elements 6 and which in this example also carries the common electrode 35 may be formed of any suitable insulative material capable of transmitting light to be detected by the photosensitive elements. However the actual nature of the second substrate 7 may depend upon the manner in which the lens elements 6 are formed.

In each of the examples described above with reference to FIGS. 1 to 4, the lens elements 6 may be formed as described in EP-A-154962 by doping the appropriate areas of the substrate 7 to define areas of altered refractive index or by defining Fresnel lens elements on the substrate 7 in the manner described in EP-A-154962. It is, however, preferred in the present example that the lens elements 6 be manufactured by coating the second substrate 7 with a layer of photosensitive resist, exposing and then developing the resist to define an array of circular mask areas each at the desired location of a lens and then heating the resultant structure to about 140° C. (degrees Celsius) at which temperature the resist melts and is drawn by surface tension into a lens shape. Such a technique is described, along with others, in a review article by Mike Hutley, Richard Stevens and Dan Daly entitled 'Microlens Arrays' and published in Physics World July 1991 at pages 27 to 32. The original thickness of the resist determines the focal length of the lens elements 6.

Where the light shielding areas 36 are present then the resist for forming the lens elements could possibly be exposed through the first substrate 2 using the light shielding areas 36 as a mask so as to automatically align the lens elements 6.

An imaging device in accordance with the invention which enables the effective focal length of the lens elements 6 to be increased can be of particular advantage where the lens elements 6 are formed of reflowed photosensitive resist because the focal length of lens elements formed in such a manner is restricted to about 2.5 times the diameter of the lens elements which means that the maximum focal length is reduced as the pitch of the photosensitive elements (and therefore the size of the lens elements) is reduced. The reason for this is that the reduction in surface energy by the surface tension is no longer sufficient to form a spherical cap when the aspect ratio (the ratio of the width/diameter of the resist island to its thickness) is lower than a critical value (0.075). However in an imaging device in accordance with the invention, the focal length of the manufactured lens elements 6 can be adjusted by applying an electrical potential across the electrodes 8a and 8b so enabling, for example, longer focal lengths to be achieved than can be achieved with a simple lens element array 5.

In operation of an image sensor in accordance with the invention, light incident on the lens elements 6 is focussed by them onto the associated photosensitive elements 3. In order to adjust the focus of the image sensor so as, for example, to sharpen an image, an electrical potential is applied across the electrodes 8a (or 8'a) and 8b which by virtue, generally, of the Pockels effect causes the liquid crystal material to become birefringent so altering the manner in which it refracts light and therefore necessarily altering the optical path length through the liquid crystal which thus alters the optical path length between the lens element 6 and the photosensitive element 4 so adjusting the focal point of the lens. Where as in the example illustrated in FIG. 4, the liquid crystal material 8 is notionally divided, by virtue of the matrix array of separate picture element electrodes 8'a, into separately controllable portions with each one being associated with a respective lens element 6, then the optical path between an individual selected lens element 6 and the associated photosensitive element 4 may be adjusted so as to control the focus at selected parts of the image.

Although in the examples described above, the lens elements 6 face away from the photosensitive elements 4, the second array 5 could be inverted so that the lens elements 6 face the photosensitive elements 4.

Also although in the examples described above the imaging elements are photosensitive elements, any suitable form of imaging element may be used. Thus, for example, the imaging elements may comprise display elements so that the first array forms a display, for example an LCD display, rather than an image sensor array, or each imaging element may comprise both a photosensitive and a display element.

From reading the present disclosure, other modifications and variations will be apparent to persons skilled in the art. Such modifications and variations may involve other features which are already known in the art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. An imaging device comprising a first substrate carrying an array of imaging elements and an array of lens elements with each lens element being associated with at least one imaging element for concentrating light travelling on a light path between the imaging element and the at least one lens element, characterised in that an electro-optic material having an electrically alterable refractive index is provided in a space defined between a second substrate and one of the imaging element and the lens element arrays and in that means are provided for applying an electrical potential across the electro-optic material to adjust the effective focal length of the lens elements.

2. An imaging device according to claim 1, wherein the lens element array is carried by the second substrate and the space for the electro-optic material is provided between the imaging element array and the second substrate.

3. An imaging device according to claim 1, wherein the space for the electro-optic material is provided between the lens element array and the second substrate.

4. An imaging device according to claim 1, wherein the means for applying an electrical potential across the electro-optic material comprises a light-transmissive electrode carried by the second substrate adjacent the electro-optic material.

5. An imaging device according to claim 4, wherein the means for applying an electrical potential across the electro-optic material comprises a further light-transmissive electrode associated with the one of the imaging element array and the lens element array.

6. An imaging device according to claim 4, wherein the means for applying an electrical potential across the electro-optic material comprises a respective further electrode associated with each element of the one of the imaging element array and the lens element array, with each further electrode being associated with a respective switching element for controlling the application of an electrical potential between that further electrode and the light-transmissive electrode carried by the second substrate.

7. An imaging device according to claim 1, wherein the electro-optic material comprises a liquid crystal.

8. An imaging device according to claim 1, wherein each lens is associated with a single imaging element.

9. An imaging device according to claim 1, wherein each imaging element comprises a photosensitive diode.

10. An imaging device according to claim 1, wherein the array of imaging elements comprises a two-dimensional array of thin-film imaging elements.

11. An imaging device according to claim 2, wherein the means for applying an electrical potential across the electro-optic material comprises a light-transmissive electrode carried by the second substrate adjacent the electro-optic material.

12. An imaging device according to claim 3, wherein the means for applying an electrical potential across the electro-optic material comprises a light-transmissive electrode carried by the second substrate adjacent the electro-optic material.

13. An imaging device according to claim 11, wherein the means for applying an electrical potential across the electro-optic material comprises a further light-transmissive electrode associated with the one of the imaging element array and the lens element array.

14. An imaging device according to claim 12, wherein the means for applying an electrical potential across the electro-optic material comprises a further light-transmissive electrode associated with the one of the imaging element array and the lens element array.

15. An imaging device according to claim 11, wherein the means for applying an electrical potential across the electro-optic material comprises a respective further electrode associated with each element of the one of the imaging element array and the lens element array, with each further electrode being associated with a respective switching element for controlling the application of an electrical potential between that further electrode and the light-transmissive electrode carried by the second substrate.

16. An imaging device according to claim 12, wherein the means for applying an electrical potential across the electro-optic material comprises a respective further electrode associated with each element of the one of the imaging element array and the lens element array, with each further electrode being associated with a respective switching element for controlling the application of an electrical potential between that further electrode and the light-transmissive electrode carried by the second substrate.

17. An imaging device according to claim 2, wherein the electro-optic material comprises a liquid crystal.

18. An imaging device according to claim 3, wherein the electro-optic material comprises a liquid crystal.

19. An imaging device according to claim 2, wherein each lens is associated with a single imaging element.

20. An imaging device according to claim 3, wherein each lens is associated with a single imaging element.

* * * * *